United States Patent
Ota et al.

(10) Patent No.: US 6,521,517 B1
(45) Date of Patent: Feb. 18, 2003

(54) METHOD OF FABRICATING A GATE ELECTRODE USING A SECOND CONDUCTIVE LAYER AS A MASK IN THE FORMATION OF AN INSULATING LAYER BY OXIDATION OF A FIRST CONDUCTIVE LAYER

(75) Inventors: Kazunobu Ota, Tokyo (JP); Masashi Kitazawa, Tokyo (JP); Masayoshi Shirahata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 229 days.

(21) Appl. No.: 09/620,138

(22) Filed: Jul. 20, 2000

(30) Foreign Application Priority Data

Jan. 31, 2000 (JP) .......................... 2000-021165

(51) Int. Cl.⁷ ............................. H01L 21/336
(52) U.S. Cl. ...................................... 438/585
(58) Field of Search ................. 438/585, 303, 438/305, 488, 490

(56) References Cited

U.S. PATENT DOCUMENTS 5,981,368 A * 11/1999 Gardner et al. ............. 438/595

* cited by examiner

*Primary Examiner*—Michael S. Lebentritt
*Assistant Examiner*—Beth E. Owens
(74) *Attorney, Agent, or Firm*—Oblon, Spivak, McClelland, Maier & Neustadt, P.C.

(57) ABSTRACT

A method of manufacturing a semiconductor device. The method includes forming a gate insulating film on a surface of a semiconductor substrate of a first conductivity type, forming a first conductive layer on the gate insulating film, selectively forming a second conductive layer on the first conductive layer, and selectively imparting an insulating property to the first conductive layer by using the second conductive layer as a mask, to obtain an insulating layer. The method also includes forming a pair of source/drain regions of a second conductivity type opposite to the first conductivity type, so as to sandwich therebetween the surface of the semiconductor substrate underlying the first conductive layer left when the first conductive layer was imparted the insulating property.

10 Claims, 17 Drawing Sheets

F I G. 3
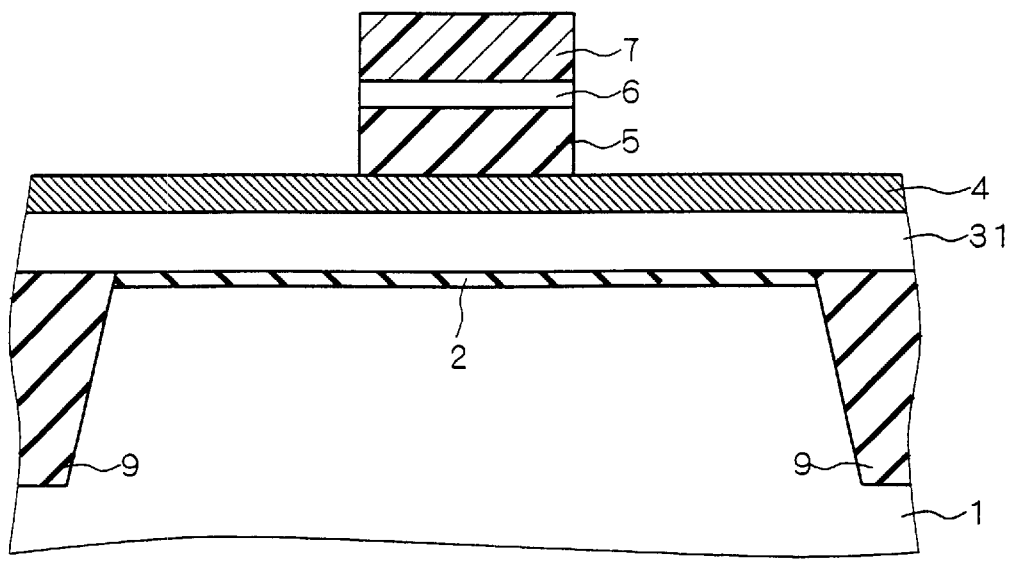
F I G. 4
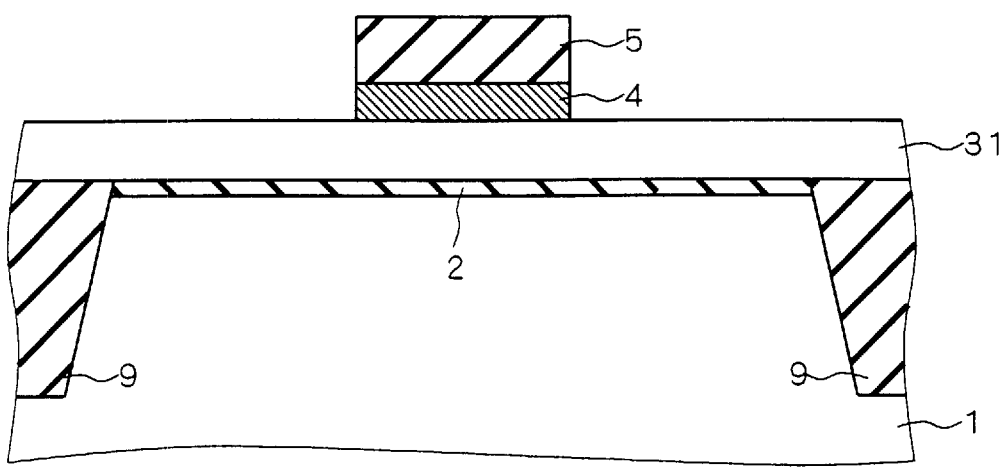

F I G. 7
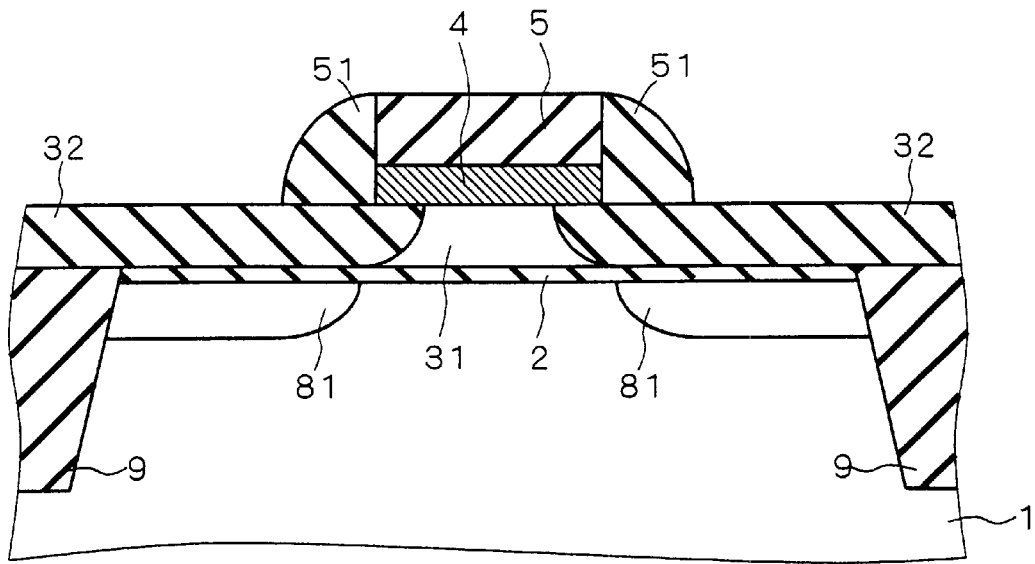
F I G. 8
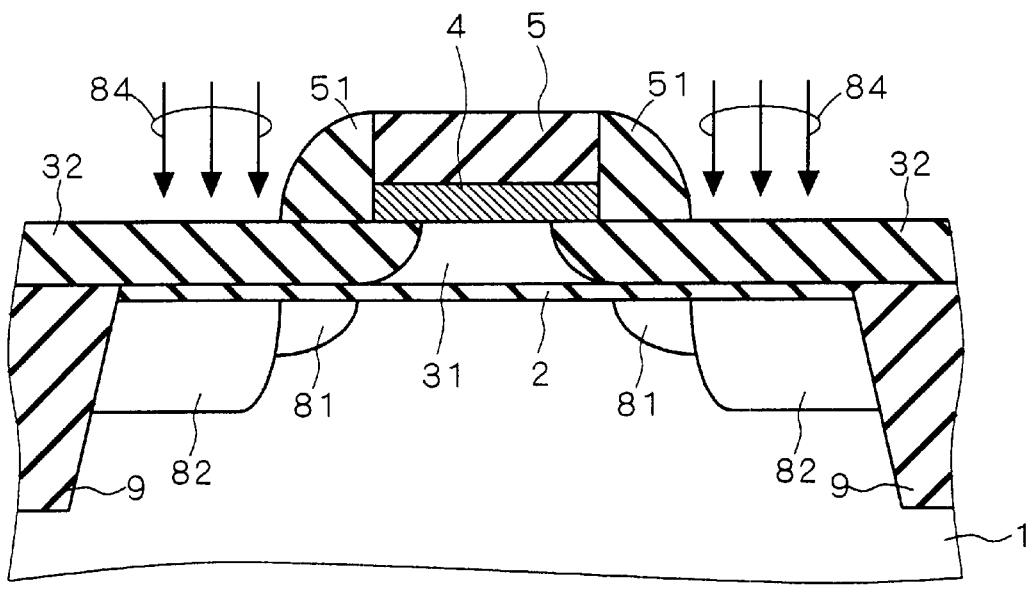

F I G. 1 1
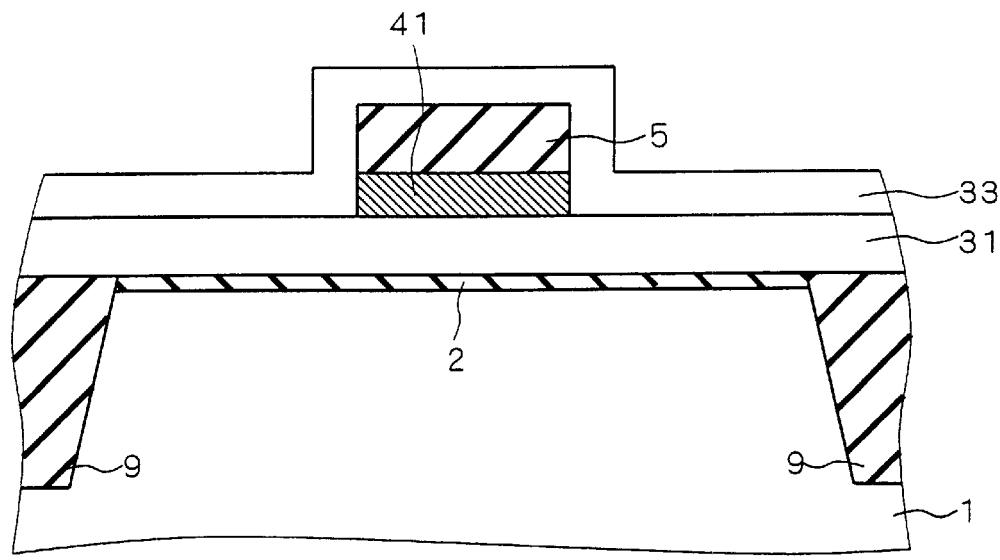
F I G. 1 2
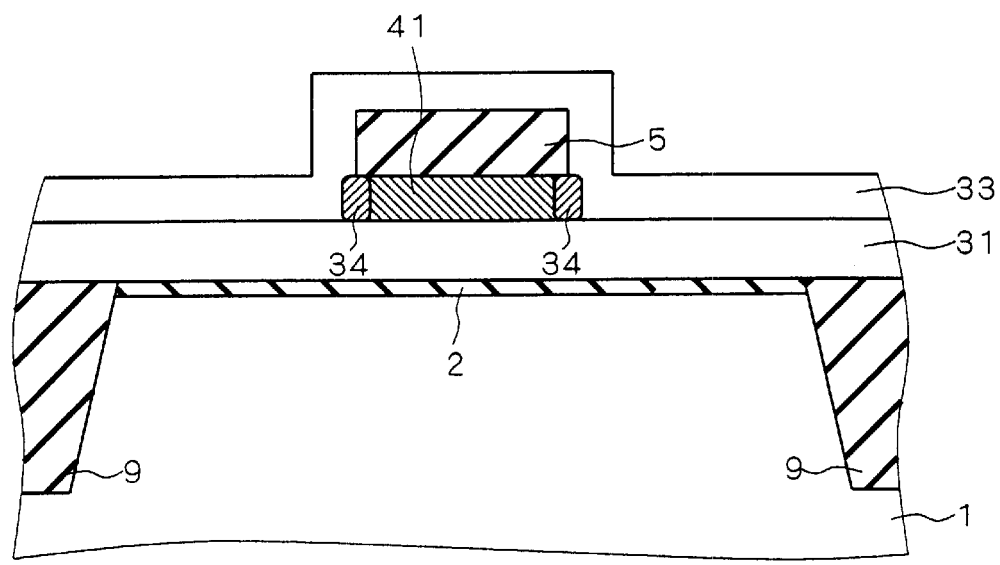

F I G. 15
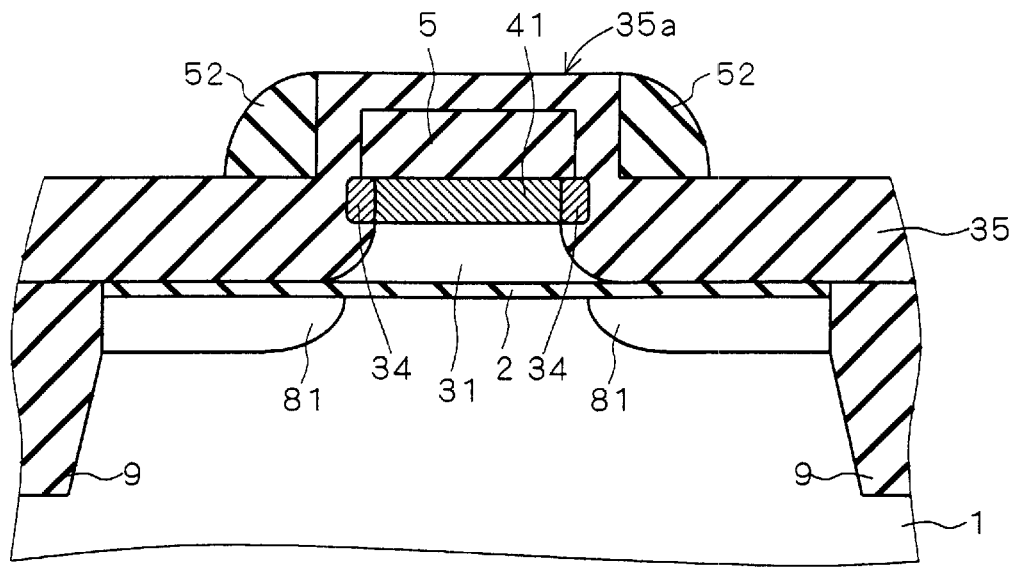
F I G. 16
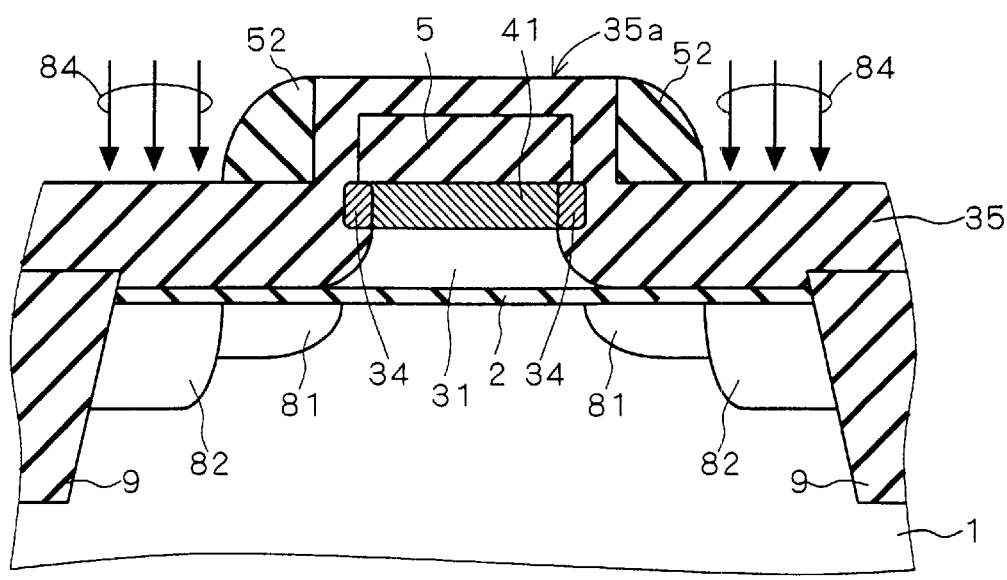

F I G. 17
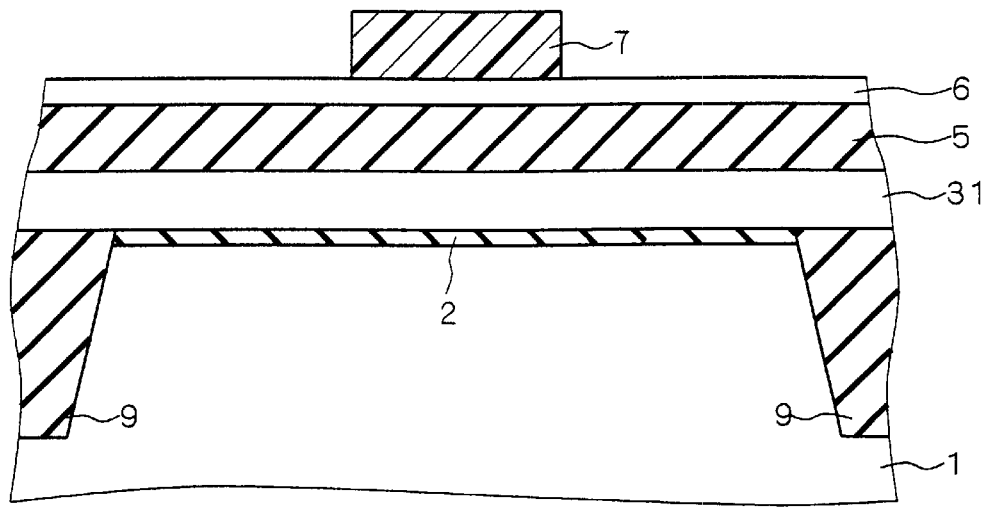
F I G. 18
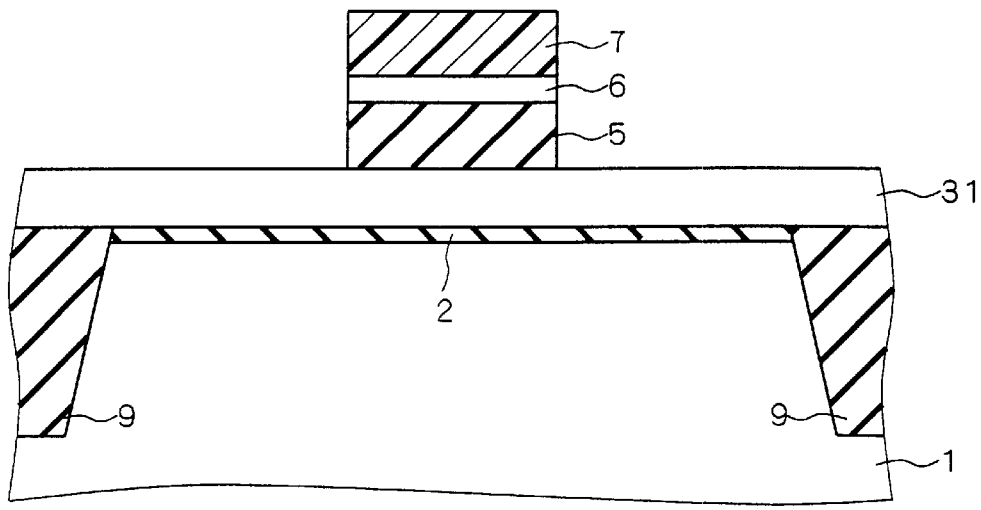

F I G. 19
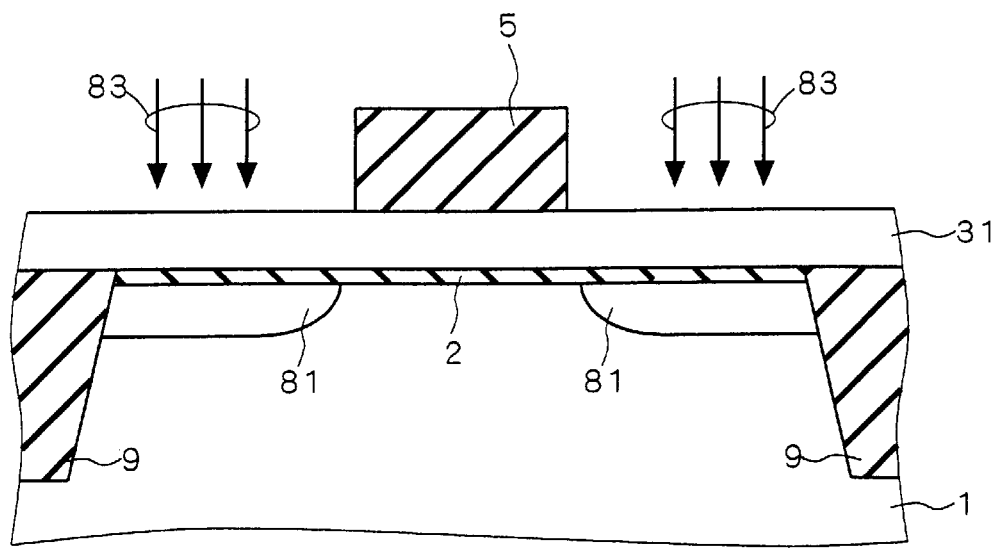
F I G. 20
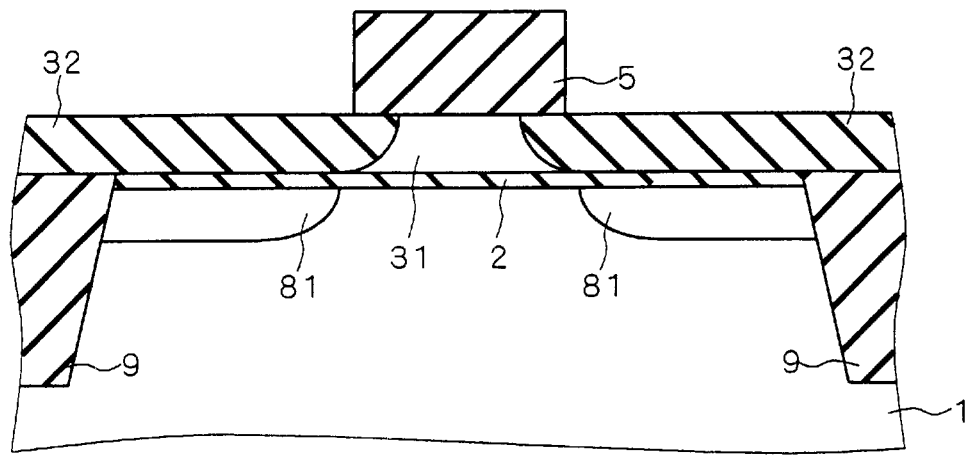

F I G. 25
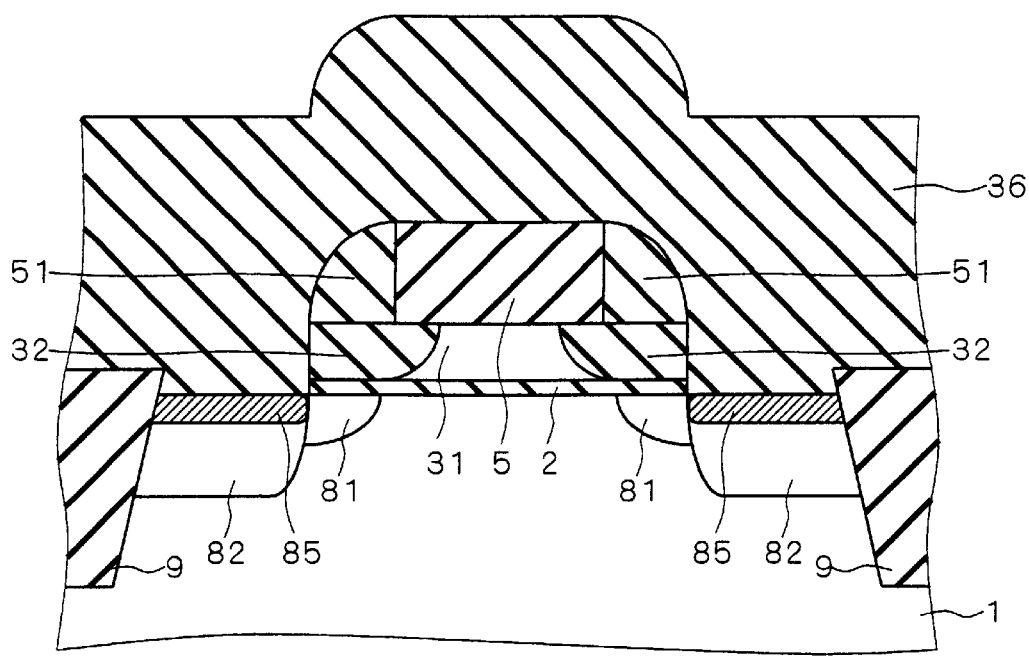
F I G. 26
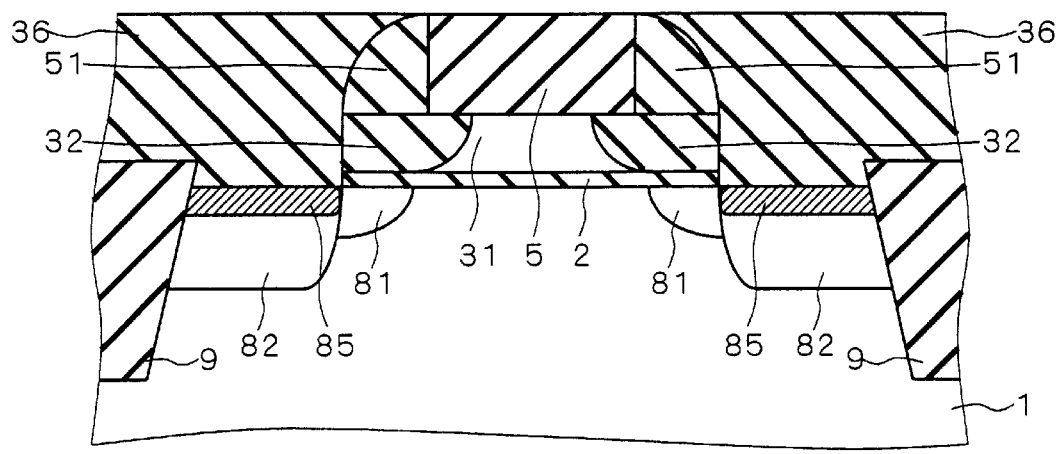

METHOD OF FABRICATING A GATE ELECTRODE USING A SECOND CONDUCTIVE LAYER AS A MASK IN THE FORMATION OF AN INSULATING LAYER BY OXIDATION OF A FIRST CONDUCTIVE LAYER

BACKGROUND OF THE INVENTION

1. Field of the Invention

The present invention relates to a semiconductor device having a MOS (Metal Oxide Semiconductor) transistor, and a method of manufacturing the same. As used herein, the term "MOS transistor" denotes a field effect transistor having a MOS structure, and is also used as the concept including the case where not only an oxide but also another insulator is employed as a gate insulating film.

2. Description of the Background Art

FIG. 30 is a cross section illustrating the step of forming a gate electrode in a conventional method of manufacturing a MOS transistor. In the surface of a semiconductor substrate 1, an active region is defined by an element isolation region 9, such as a trench isolation. A gate insulating film 2 is then formed on the surface of the semiconductor substrate 1 by performing thermal oxidation.

Subsequently, a stacked structure comprising a polysilicon layer 3, silicide layer 4, and a nitride film 5 that functions later as a hard mask, is temporarily formed on the entire surface, and an anti-reflection coating film (not shown) is stacked thereon. After a resist (not shown) is applied to the entire surface, a pattern transfer and its development are performed so that the resist is of a predetermined shape. By using the resulting resist pattern as a mask, the nitride film 5 is formed in a predetermined shape by etching. By using the resulting nitride film 5 as a hard mask, an etching is conducted so that the silicide layer 4 and polysilicon layer 3 are made into the same shape as the nitride film 5, when viewed from above, thereby obtaining the structure shown in FIG. 30.

When an oxide film is employed as a gate insulating film 2, the etching of the polysilicon layer 3 can be performed in a high etching selective ratio to the gate insulating film 2. Therefore, even when the polysilicon layer 3 is further etched from the state that it remains only beneath the nitride film 5, it is able to reduce the amount of etching of the gate insulating film 2.

Thus, the feature that the area making a direct contact with a gate insulating film is formed with polysilicon, enables to reduce the difference in the work function with silicon, as compared to the case where an NMOS transistor and PMOS transistor are both formed with a single metal or silicide.

Recently, as semiconductor devices have lower operating current and higher speed, its gate insulating film becomes thinner. Further, it is intended that a gate nitride film having a higher dielectric constant is substituted for a gate oxide film.

However, the etching selective ratio of a nitride film to polysilicon cannot be made so high as that of an oxide film to polysilicon. Therefore, the adoption of a nitride film as a gate insulating film 2 and the adoption of polysilicon as the portion of a gate electrode making a direct contact with the gate insulating film 2 have caused a drawback requiring a rigid control during etching for modifying the polysilicon as the gate electrode.

FIGS. 31 and 32 are cross sections illustrating an aspect that can occur in the event of failure of the rigid control of the above etching. That is, FIG. 31 shows the state that a gate insulating film 2 used instead of the gate oxide film 21 in FIG. 30 is broken during the etching of polysilicon, and an etchant reaches the semiconductor substrate 1, thereby forming a void 11 in the semiconductor substrate 1. Even if an oxide film is employed as the gate insulating film 2, such a problem becomes significant when the thickness of the oxide film is reduced.

Even if the etchant does not reach the semiconductor substrate 1, when the gate insulating film 2 becomes thin, an etching induced damage remains in the semiconductor substrate 1. FIG. 32 shows the state that an etching induced damage 12 occurs in the semiconductor substrate 1. The etching induced damage 12 acts as the trap of carrier. For instance, in an LDD (Lightly Doped Drain) structure, an extension region is formed which is continuous with a source/drain, and has a lower impurity concentration than that of the source/drain. This trap reduces the carrier concentration, in particular, the carrier concentration in the extension region, and also increases the parasitic resistance of a transistor. An increase in parasitic resistance causes an increase in heat generation and a reduction in operating speed, on an integrated circuit.

SUMMARY OF THE INVENTION

According to a first aspect of the present invention, a method of manufacturing a semiconductor device comprises the steps of: (a) forming a gate insulating film on a surface of a semiconductor substrate of a first conductivity type; (b) forming a first conductive layer on the gate insulating film; (c) selectively forming a second conductive layer on the first conductive layer; (d) selectively imparting an insulating property to the first conductive layer by using the second conductive layer as a mask, to obtain an insulating layer; and (e) forming a pair of source/drain regions of a second conductivity type opposite to the first conductivity type, so as to sandwich therebetween the surface of the semiconductor substrate underlying the first conductive layer left in the step (d).

According to a second aspect, the method of the first aspect is characterized in that the first conductive layer is composed of a doped semiconductor, and the doped semiconductor is selectively oxidized in the step (d), the method further comprising the step, after the step (e), of: (f) performing an etching of the insulating layer and the gate insulating film so that these are selectively removed to expose the source/drain regions.

Preferably, the method of the second aspect further comprises the step of: (g) performing a silicidation of the source/drain regions exposed in the step (f).

According to a third aspect, the method of the second aspect further comprises the step, after the step (c) and before the step (d), of: (g) implanting impurities to the surface of the semiconductor substrate by using the second conductive layer as a mask, so as to form a pair of extension regions of the second conductivity type in the surface of the semiconductor substrate.

According to a fourth aspect, the method of the second aspect is characterized in that the second conductivity layer is composed of metal, and, in the step (d) an oxidation is conducted in an oxidizing atmosphere having a reducing component.

Preferably, the reducing component includes hydrogen.

According to a fifth aspect, the method of the first aspect further comprises the step, after the step (c) and before the step (d), of: (f) forming a coating layer covering the second conductive layer and the first conductive layer, and is characterized in that in the step (d), insulating property is imparted to said coating layer and said coating layer becomes part of the insulating layer.

According to a sixth aspect, the method of the fifth aspect is characterized in that the first conductive layer is composed of a first semiconductor doped, that the coating layer is composed of a material that is an oxidizable material, and that the first semiconductor and the material are oxidized in the step (d), the method further comprising the step, after the step (e), of: (f) selectively removing the insulating film and the gate insulating film to expose the source/drain region.

According to a seventh aspect, the method of the sixth aspect further comprises the step, after the step (d) and before the step (f), of: (g) implanting impurities to the surface of the semiconductor substrate by using, as a mask, the second conductive layer and the coating layer present on the side of the second conductive layer, thereby to form a pair of extension regions of the second conductivity type in the surface of the semiconductor substrate.

According to an eighth aspect, the method of the sixth aspect is characterized in that the second conductive layer is composed of metal, and that the coating layer is composed of a second semiconductor, the method further comprising the step, after the step (d) and before the step (f), of: (g) performing a heat treatment for forming a silicide layer at the interface between the second conductive layer and the coating layer.

According to a ninth aspect, a method of manufacturing a semiconductor device comprises the steps of: (a) forming a gate insulating film on a surface of a semiconductor substrate of a first conductivity type; (b) forming a first conductive layer on the gate insulating film; (c) selectively forming a dummy gate on the first conductive layer; (d) selectively imparting an insulating property to the first conductive layer by using the dummy gate as a mask, thereby to obtain a first insulating layer; (e) forming a pair of source/drain regions of a second conductivity type opposite to the first conductivity type, so as to sandwich therebetween the surface of the semiconductor substrate underlying the first conductive layer left in the step (d); (f) forming a second insulating layer on the structure resulting from the steps (a) to (e); (g) polishing the second insulating layer from its surface, to expose the dummy gate; (h) removing the dummy gate to form a recess surrounded by the second insulating layer, the first conductive layer left in the step (d), and the first insulating layer; and (i) providing in the recess a third conductive layer making contact with the first conductive layer.

Preferably, in the method of the ninth aspect, the step (i) includes: (i-1) forming the third conductive layer on the second insulating layer, filling the recess; and (i-2) polishing the third conductive layer from its surface, to expose the second insulating layer.

According to a tenth aspect, the method of the ninth aspect is characterized in that the first conductive layer is composed of a doped semiconductor, and that the semiconductor is selectively oxidized in the step (d), the method further comprising the step, after the step (e), of: (j) performing an etching of the insulating layer and the gate insulating film so that these are selectively removed to expose the source/drain region.

Preferably, the method of the tenth aspect further comprises the step of: (k) performing a silicidation of the source/drain region exposed in the step (j).

According to an eleventh aspect, the method of the tenth aspect further comprises the step, after the step (c) and before the step (d), of: (k) implanting impurities to the surface of the semiconductor substrate by using the dummy gate as a mask, thereby to form a pair of extension regions of the second conductivity type in the surface of the semiconductor substrate.

Preferably, in the method of the eleventh aspect, the step (e) includes: (e-1) forming a sidewall on the side of the dummy gate; and (e-2) implanting impurities to the surface of the semiconductor substrate by using the dummy gate and the sidewall, as mask.

According to a twelfth aspect, a semiconductor device comprises: a gate insulating film selectively provided on a surface of a semiconductor substrate of a first conductivity type; a conductor facing the surface through the gate insulating film; an interposing layer disposed between the conductor and the gate insulating film, the interposing layer having an insulating property at least beneath the end of the conductor, and having a conductivity at least beneath the center of the conductor; and a pair of source/drain regions of a second conductivity type opposite to the first conductivity type, the source/drain regions being disposed in an area of the surface which is exposed by the absence of the gate insulating film, and sandwiching therebetween the surface underlying the conductor.

Preferably, the semiconductor device of the twelfth aspect further comprises a pair of extension regions of the second conductivity type disposed in the surface, the extension regions extending closer to an area underlying the center of the conductor, than does the source/drain region.

More preferably, the semiconductor device of the twelfth aspect further comprises a silicide layer disposed in the surface of the source/drain region.

With the method of the first or fifth aspect, the first conductive layer is not etched but is left only below the second conductive layer by imparting insulating property in a self-aligned manner, by using the second conductive layer as a mask. The second conductive layer and the first conductive layer left therebelow cooperate in functioning as a gate electrode. It is therefore able to reliably form a gate electrode even when using, as a gate insulating film, a material with which it is unable to have a high etching selective ratio to the first conductive layer.

With the method of the second or sixth aspect, the insulating layer and gate insulating film are etched in the step (f). This permits a reliable formation of a gate electrode even when using, as a gate insulating film, a material with which it is unable to have a high etching selective ratio to the first conductive layer.

With the method of the third or eleventh aspect, a semiconductor is expanded by the oxidation in the step (d). Therefore, the ion implantation for forming an extension region is facilitated by performing it after the step (c) and before the step (d).

With the method of the fourth aspect, the gate electrode resistance can be lowered by using metal for the second conductive layer. The oxidization is conducted in the presence of a reducing component in the step (d), thus preventing the second conductive layer composed of metal from being oxidized.

With the method of the seventh aspect, a semiconductor is expanded by the oxidation in the step (d). Therefore, the ion implantation for forming an extension region is facilitated by performing it after the step (f) and before the step (d).

With the method of the eighth aspect, the gate electrode resistance can be lowered by using metal for the second conductive layer. It is able to prevent the second conductive layer composed of metal from being oxidized, because the silicide layer formed in the step (g) functions as a mask against oxidization.

With the method of the ninth aspect, the first conductive layer is not etched, however, with a dummy gate acting as a mask, this layer is left only below the dummy gate by imparting insulating property in a self-aligned manner. The third conductive layer provided in a recess formed at the area where the dummy gate has been present, and also the first conductive layer left below the third conductive layer, cooperate in functioning as a gate electrode. It is therefore able to reliably form a gate electrode even when using, as a gate insulating film, a material with which it is unable to have a high etching selective ratio to the first conductive layer.

With the method of the tenth aspect, the first insulating layer and gate insulating film are etched in the step (j). This enables to reliably form a gate electrode even when using, as a gate insulating film, a material with which it is unable to have a high etching selective ratio to the first conductive layer.

With the method of the twelfth aspect, the lower portion of the end of the conductor has insulating property, thereby providing superior insulation between the source/drain regions and the gate electrode which is formed by the conductor and the portion of the interposing layer which has a conductivity.

It is an object of the present invention to provide a technique of permitting a reliable formation of a gate electrode even when using, as a gate insulating film, a material, e.g., a nitride film, with which it is unable to have a high etching selective ratio to polysilicon.

These and other objects, features, aspects and advantages of the present invention will become more apparent from the following detailed description of the present invention when taken in conjunction with the accompanying drawings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1 to 10 are cross sections illustrating a sequence of steps in a method of manufacturing a semiconductor device according to a first preferred embodiment of the invention;

FIGS. 11 and 16 are cross sections illustrating a sequence of steps in a method of manufacturing a semiconductor device according to a second preferred embodiment;

FIGS. 17 to 29 are cross sections illustrating a sequence of steps in a method of manufacturing a semiconductor device according to a third preferred embodiment;

DESCRIPTION OF THE PREFERRED EMBODIMENTS

First Preferred Embodiment

Figure 1:
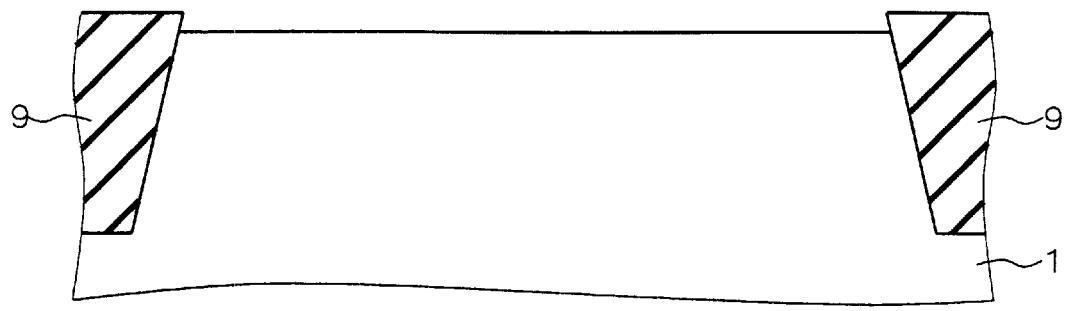
Figure 2:
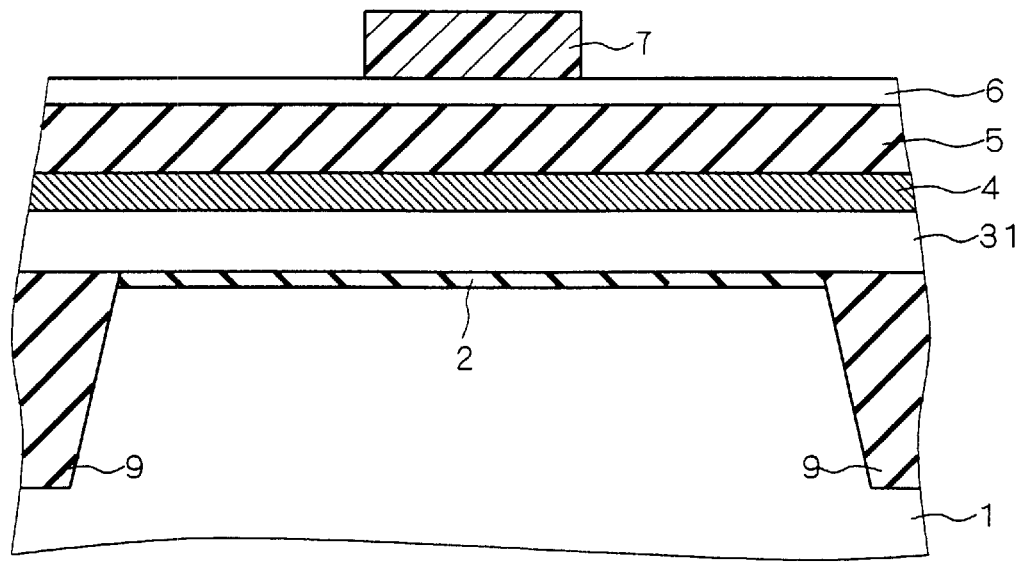
Figure 5:
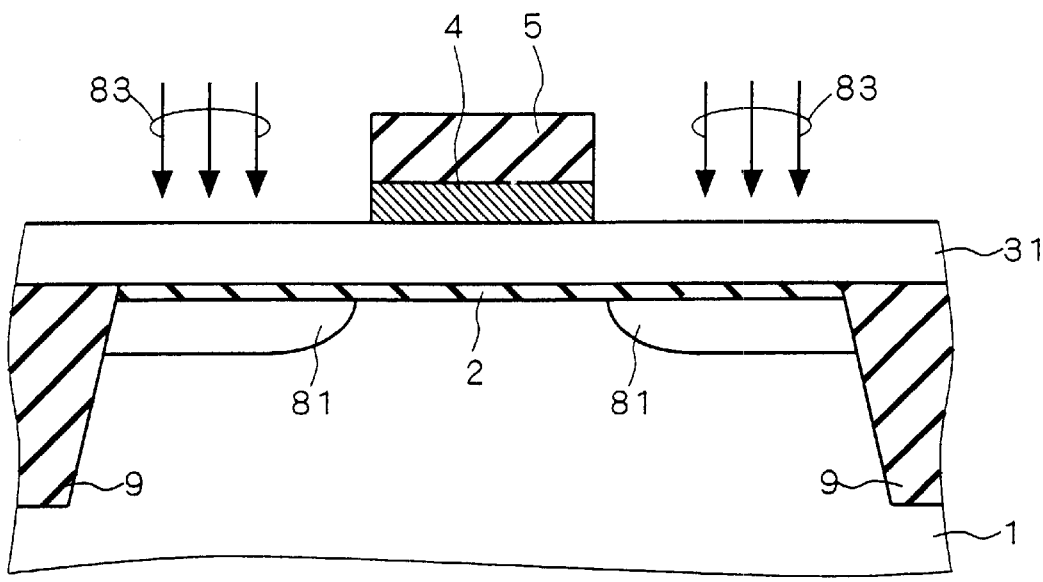

Referring now to the drawings, wherein like reference numerals designate identical or corresponding parts throughout the several views, and more particularly in FIGS. 1–10, FIGS. 1 to 10 are cross sections illustrating a sequence of steps in a method of manufacturing a semiconductor device according to a first preferred embodiment of the invention. Referring now to FIG. 1, a trench type isolation region 9 filled with an insulator is formed on a semiconductor substrate 1 which is composed mainly of silicon, for example. The trench type isolation region 9 functions to electrically isolate a transistor to be formed in an active region, from the surrounding.

Subsequently, by using a silicon oxide film to be formed by thermal oxidation, nitride oxide film, or, nitride film, a gate insulating film 2 is formed in a thickness of about 1 to 4 nm, and a polysilicon layer 31 is deposited thereon in a thickness of 5 to 100 nm. A silicide layer 4 is then formed in a thickness of 50 to 200 nm, on the polysilicon layer 31. The thickness above described are just examples and not restricted to the values.

The polysilicon layer 31 has a conductivity. As a technique, a polysilicon layer 31 is previously doped by using, for example, phosphorus as impurities. The impurity concentration is set to, for example, $1 \times 10^{20}$ to $1 \times 10^{21}$ cm$^{-3}$. Alternatively, when transistors are formed after a polysilicon layer 31 is temporally deposited by using an undoped silicon, an ion implantation technique may be utilized. That is, phosphorous is used for making an NMOS transistor, and arsenic is used for making a PMOS transistor. Ion implantation employing different ions depending on the area, is attainable by a known technique of masking with a patterned resist.

Subsequently, a nitride film 5 serving as the material of a hard mask, is deposited on the silicide layer 4 in a thickness of 20 to 300 nm for example, and an anti-reflection coating film 6 is formed thereon. A resist 7 is formed on the anti-reflection coating film 6 and, by photolithography technology, it is then shaped as a mask pattern for obtaining a gate electrode. This results in the structure shown in FIG. 2. The gate width is set to, for example, 0.05 to 0.3 μm.

Figure 31:
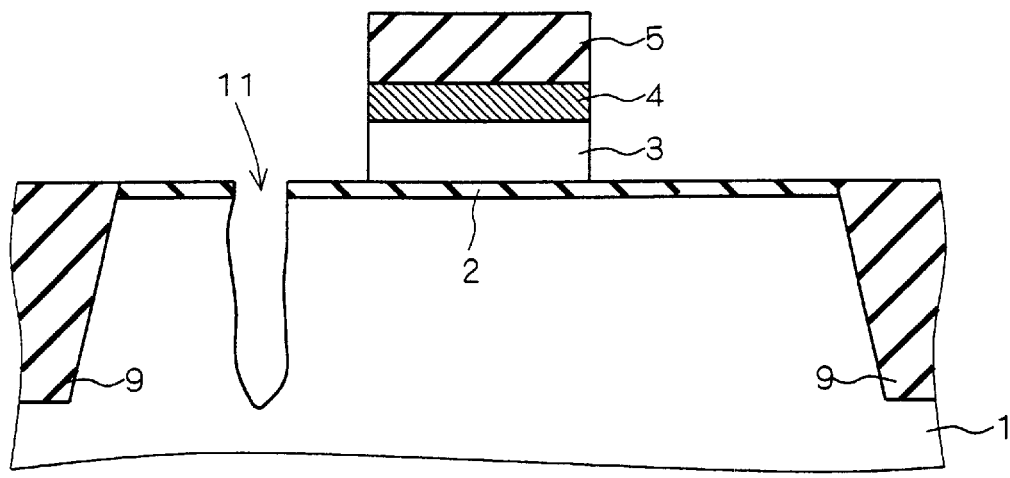
FIGS. 31 to 33 are cross sections illustrating a problem in the conventional technique.
Figure 32:
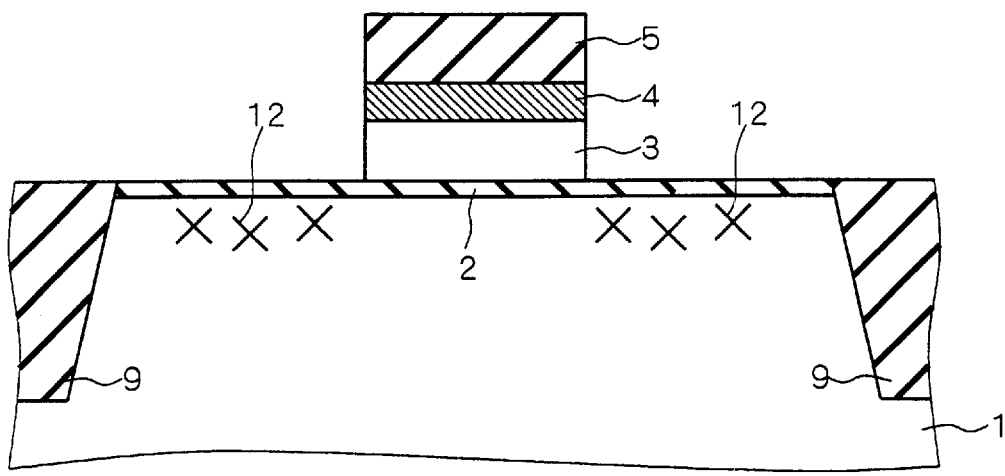

By using the resulting resist 7 as a mask, the nitride film 5 is etched to shape as a hard mask. At this time, the anti-reflection coating film 6 is also etched in the same shape, resulting in the structure shown in FIG. 3. After removing the anti-reflection coating film 6 and resist 7, an etching of the silicide layer 4 is performed by using the nitride film 5 as a mask. This results in the structure shown in FIG. 4. At this time, the portion of the polysilicon layer 31 which is not covered with the silicide layer 4 might be etched, however, such problems as shown in FIGS. 31 and 32 are avoidable by controlling the etching so that at least part of the polysilicon layer 31 is left on the gate insulating film 2 and trench type isolation region 9.

By using the nitride film 5 and silicide layer 4 as a mask, ions 83 is implanted from the polysilicon layer 31 side. For transistors having different conductivity types, one type transistor is (or one type transistors are) masked with a patterned resist. For making an NMOS transistor, arsenic is employed as ions 83. For example, the arsenic ion accelerated energy is set to 20 to 100 keV, and its dosage is set to $5 \times 10^{14}$ to $5 \times 10^{15}$ cm$^{-2}$. For making a PMOS transistor, boron fluoride (BF2) is employed as ions 83. For example, the boron fluoride ion accelerated energy is set to 5 to 50 keV, and the boron fluoride ion dosage is set to $1 \times 10^{14}$ to $5 \times 10^{15}$ cm$^{-2}$. Thereby, an extension region 81 is formed in the surface of the semiconductor substrate 1, resulting in the structure shown in FIG. 5.

In this step, a pocket implantation may be performed. For making an NMOS transistor, boron is implanted at an accelerated energy of 10 to 30 keV, and at a dosage of $1\times10^{13}$ to $5\times10^{13}$ cm$^{-2}$. For making a PMOS transistor, arsenic is implanted at an accelerated energy of 50 to 200 keV, and at a dosage of $1\times10^{13}$ to $5\times10^{13}$ cm$^{-2}$. In the case of the pocket implantation, it is conducted while rotating the axis of implantation at an angle of 10 to 50° with respect to the normal line of the main surface of the polysilicon layer 31, in order that the impurities are implanted to the area underlying the gate electrode. Subsequently, a heat treatment is conducted for electrically activating the implanted impurities. This heat treatment is conducted, for example, at a temperature of 800 to 1100° C., for about 5 to 60 seconds.

Figure 6:
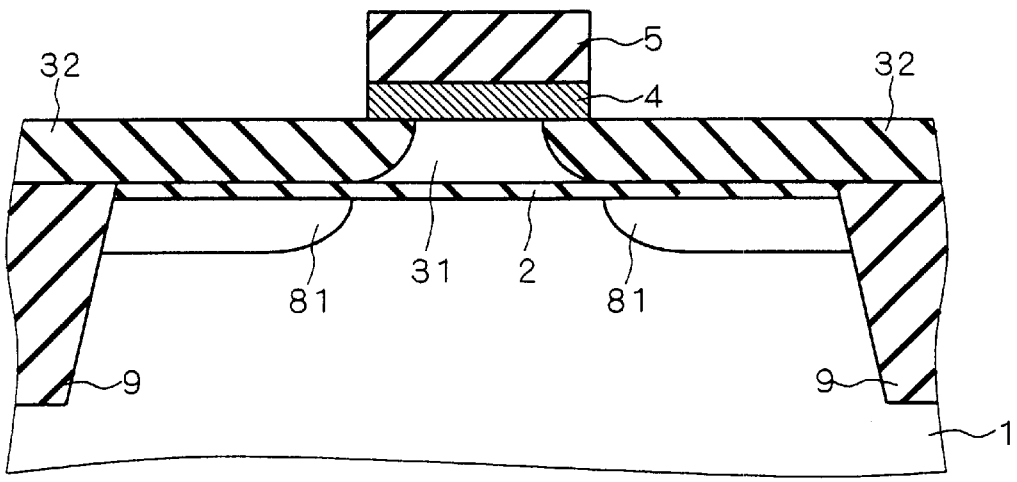

Subsequently, the polysilicon layer 31 that has had a conductivity is subjected to treatment for selectively imparting insulating property thereto. Specifically, the polysilicon layer 31 is oxidized by performing a thermal oxidation in an oxidizing atmosphere, thereby to form an oxide layer 32. The temperature of the thermal oxidation is set, for example, to 700 to 1100° C. The oxide layer 32 is also formed above the extension region 81 and on the trench type isolation region 9. Since the silicide layer 4 and nitride film 5 function as a mask against oxidation, the polysilicon layer 31 is left at least centrally of the area therebelow, and is surrounded by the oxide layer 32. FIG. 6 shows an aspect that the oxide layer 32 extends closer to an area underlying the center of the silicide layer 4, than does the extension region 81. However, the present invention is not limited to this aspect.

Subsequently, a nitride film is formed in a thickness of 30 to 100 nm, for example, on the entire surface of the structure shown in FIG. 6. By performing an etch back of the nitride film, a sidewall 51 composed of the nitride film is left on the side of the silicide layer 4 and nitride film 5. This results in the structure shown in FIG. 7.

Ions 84 are implanted from the oxide layer 32 side, by using the nitride film 5, silicide layer 4 and sidewall 51, as mask. For transistors having different conductivity types, one type transistor is (or one type transistors are) masked with a patterned resist. For making an NMOS transistor, arsenic is employed as ions 84. For example, the arsenic ion accelerated energy is set to 20 to 100 keV, and its dosage is set to $1\times10^{15}$ to $5\times10^{16}$ cm$^{-2}$. For making a PMOS transistor, boron fluoride (BF$_2$) is employed as ions 84. For example, the boron fluoride ion accelerated energy is set to 10 to 100 keV, and the boron fluoride ion dosage is set to $1\times10^{15}$ to $5\times10^{16}$ cm$^{-2}$. Thereby, a pair of source/drain region 82 is formed in the surface of the semiconductor substrate 1, so as to sandwich therebetween the surface of the semiconductor substrate 1 underlying the silicide layer 4. This results in the structure shown in FIG. 8. Then, a heat treatment for electrically activating the implanted impurities is performed. This heat treatment is conducted, for example, at a temperature of 800 to 1100° C., for about 5 to 60 seconds.

Figure 9:
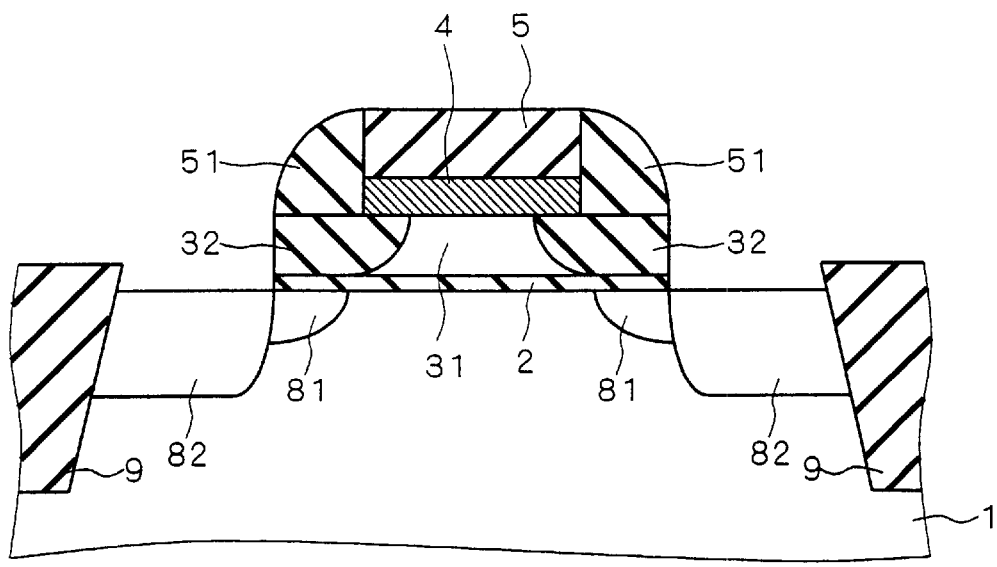

Thereafter, the portion of the oxide layer 32 and gate insulating film 2 which are not covered with the nitride film 5, silicide layer 4, or sidewall 51, are removed to expose the surface of the semiconductor substrate 1, particularly, the source/drain region 82, as shown in FIG. 9. Treatment with hydrofluoric acid or dry etching can be employed in this step. It should be noted that in the etch back of the nitride film in the step shown in FIG. 7, the upper portion of the oxide layer 32 which is not covered with the silicide layer 4 or nitride film 5, may be removed by etching.

Figure 10:
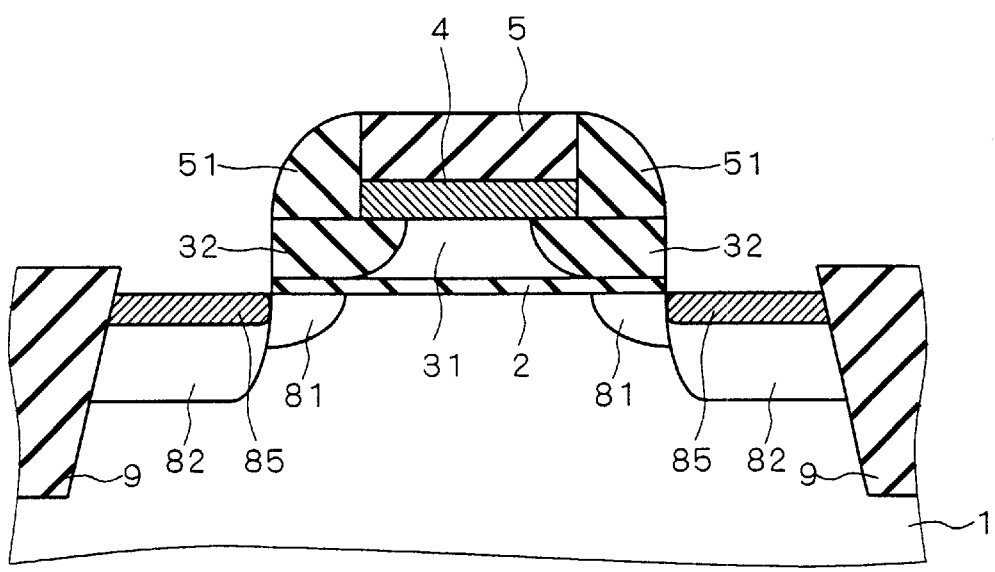
Figure 13:
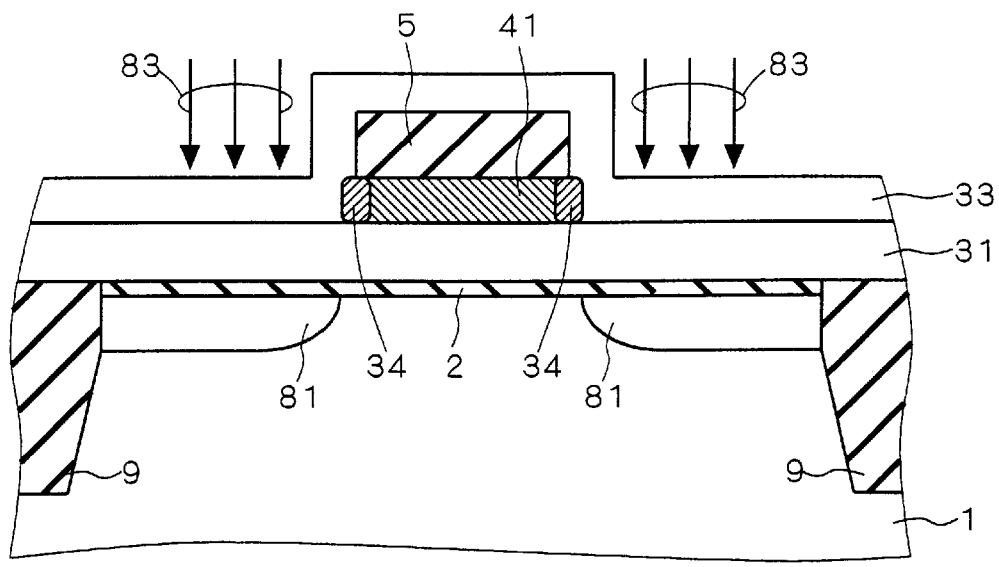
Figure 14:
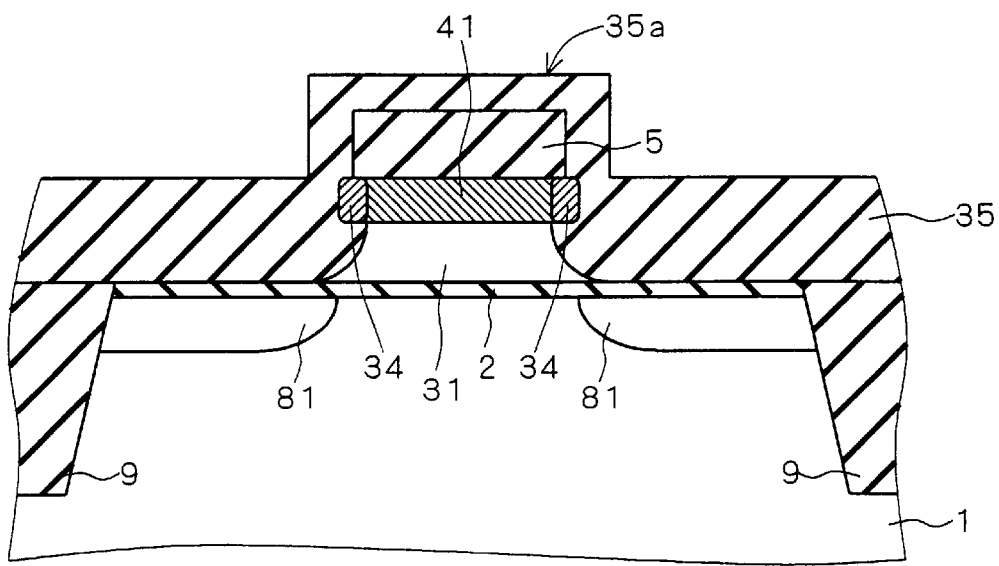

The surface of the semiconductor substrate 1 exposed in the structure shown in FIG. 9, particularly, the surface of the source/drain region 82, is subjected to silicidation for forming a silicide layer 85, resulting in the structure shown in FIG. 10. In this silicidation, for example, cobalt is temporarily deposited on the surface of the source/drain region 82, followed by heat treatment.

According to the usual method of manufacturing a semiconductor integrated circuit, the structure shown in FIG. 10 is subjected to the formation of an interlayer insulating film and wiring, thus obtaining a semiconductor integrated circuit.

Thus, with the foregoing method of manufacturing a semiconductor device, the polysilicon layer 31 is not etched but is oxidized in a self-aligned manner by using the silicide layer 4 as a mask, so that the polysilicon layer 31 is left only below the silicide layer 4. The silicide layer 4 and the polysilicon layer 31 left therebelow cooperate in functioning as a gate electrode. Alternatively, even if another etching is performed, the object to be etched is the oxide layer 32, not the polysilicon layer 31. This permits a reliable formation of a gate electrode in the event of employing, as a gate insulating film 2, a material with which it is unable to have a high etching selective ratio to the polysilicon layer 31.

Since the limitation to be imposed on the gate insulating film 2 is relaxed, the degree of freedom in determining its material and its thickness can be increased. For instance, when a nitride film is substituted for a conventional gate insulating film of the same thickness, the dielectric constant of the nitride film is about twice that of an oxide film. Therefore, even if the same gate voltage is applied, a voltage reduction in the gate insulating film is lessened, and the gate field exerted on a channel is effectively increased. Even with a gate insulating film of the same material, if its thickness is reduced, the gate field exerted on the channel is effectively increased in a similar manner. That is, the operating current of the transistor is increased, thus leading to a higher speed on the integrated circuit. Alternatively, when the operating speed is made the same as that of a conventional circuit, the supply voltage can be lowered than the case with the conventional, thereby providing the effect of reducing power consumption. Hence, if the operating speed is higher than has been heretofore obtained, it is able to manufacture an integrated circuit of which power consumption is small.

Even in the structure shown in FIG. 8, namely, the state that the oxide layer 32 is not removed, the silicide layer 4 and the polysilicon layer 31 left therebelow can cooperate in functioning as a gate electrode. Therefore, if an electrical connection with the source/drain region 82 is obtained, there is no need to remove the oxide layer 32, in order to expose the surface of the source/drain region 82, as shown in FIG. 9.

Also, the step of oxidizing the polysilicon layer 31 can be performed prior to the step of forming the extension region 81. However, the polysilicon layer 31 expands in volume with oxidization, though it is not shown clearly in the figures. It is desirable for easier ion implantation that the step of oxidizing the polysilicon layer 31 be performed after the step of forming the extension region 81, as in the first preferred embodiment.

Second Preferred Embodiment

A metal layer may be substituted for the silicide layer 4 in the first preferred embodiment. For instance, tungsten having a thickness of 20 to 200 nm can be employed as a metal layer.

In that event, treatment for suppressing the oxidation of the metal layer is required in the step of oxidizing a polysilicon layer 31. Therefore, the thermal oxidation of the polysilicon layer 31 is preferably conducted in an oxidizing atmosphere containing a reducing component, e.g., hydrogen.

Thus, by employing the metal layer instead of the silicide layer 4, the following effects are obtainable in addition to the same effect as the first preferred embodiment. Specifically, as compared to the first preferred embodiment, the gate electrode resistance can be more reduced, and the operating speed can be more increased with less power consumption. Further, the thickness of the gate electrode can be reduced when the gate electrode resistance is the same. This facilitates the step shown in FIG. 10 and later steps, such as the step of burying an interlayer insulating film.

Third Preferred Embodiment

FIGS. 11 to 16 are cross sections illustrating a sequence of steps in a method of manufacturing a semiconductor device according to a third preferred embodiment. Firstly, the structure shown in FIG. 4 is prepared like the second preferred embodiment. That is, the structure shown in FIG. 4 is obtained in the same manner as the first preferred embodiment, however, a metal layer 41 is substituted for the silicide layer 4.

Subsequently, on the entire surface of the structure shown in FIG. 4, a polysilicon layer 33 is deposited in a thickness of 5 to 20 nm, by means of vapor deposition, for example. This results in the structure shown in FIG. 11. The polysilicon layer 33 follows the contour of the outer surface of the metal layer 41 and a nitride film 5, thereby to form a convexity. Thereafter, annealing at a temperature of 700 to 1000° C. is conducted to form a silicide 34 at the interface between the metal layer 41 and polysilicon layer 33, resulting in the structure shown in FIG. 12.

In the same manner as the first preferred embodiment, ions 83 is implanted to the surface of a semiconductor substrate 1, in order to form an extension region 81. This results in the structure shown in FIG. 13. It should be noted that not only the metal layer 41 and nitride film 5, but also the polysilicon layer 33 disposed on their respective sides serves as a mask against the ions 83.

Subsequently, the polysilicon layers 31 and 33 are converted to an oxide layer 35 having insulating property. Specifically, a thermal oxidation is conducted in an oxidizing atmosphere so that the polysilicon layers 31 and 33 are oxidized to form the oxide layer 35, resulting in the structure shown in FIG. 14. Since the nitride film 5 and metal layer 41 serve as mask, the polysilicon layer 31 is left only below the metal layer 41, and is surrounded by the oxide layer 35. The oxide layer 35 also follows the contour of the outer surface of the metal layer 41 and nitride film 5, thereby to form a convexity 35a. Herein, although the metal layer 41 is employed, there is no need to add a reducing component into an oxidizing atmosphere, unlike the second preferred embodiment. This is because, at the interface between the metal layer 41 and polysilicon layer 33, the silicide 34 is already present, which functions as a mask against oxidation.

Subsequently, like the sidewall 51, a sidewall 52 composed of a nitride film is formed on the side of the convexity 35a of the oxide layer 35, resulting in the structure shown in FIG. 15. Then, ions 84 are implanted from the oxide layer 35 side, by using the nitride film 5, the metal layer 41, the silicide layer 34, the convexity 35a of the oxide layer 35, and the sidewall 52, as a mask. For transistors having different conductivity types, one type transistor is (or one type transistors are) masked with a patterned resist. Thereby, a pair of source/drain regions 82 is formed in the surface of the semiconductor substrate 1, so as to sandwich therebetween the surface of the semiconductor substrate 1 underlying the metal layer 41. This results in the structure shown in FIG. 16. Then, a heat treatment for electrically activating the implanted impurities is performed. The conditions of this heat treatment and the conditions of implanting the ions 83 and 84, can be set in the same fashion as with the first preferred embodiment.

Thereafter, the portion of the oxide layer 35 and gate insulating film 2 which is not covered with the nitride film 5, the metal layer 41, the silicide layer 34, the convexity 35a of the oxide layer 35, or the sidewall 52, is removed to expose the surface of the semiconductor substrate 1, particularly, the source/drain region 82. Treatment with hydrofluoric acid or dry etching can be employed in this step. It should be noted that the upper portion of the oxide layer 35 which is not covered with the nitride film 5, metal layer 41, silicide layer 34, or the convexity 35a of the oxide layer 35, may be removed, by etching, in the formation of the sidewall 52. The surface of the exposed source/drain region 82 can be subjected to silicidation. The succeeding steps can be proceeded in the same manner as the first preferred embodiment.

In accordance with the third preferred embodiment, the employment of the metal layer 41 produces the same effect as the second preferred embodiment. In addition, a semiconductor device can be manufactured at lower cost and with greater ease, than the case of annealing in an oxidizing atmosphere containing a reducing component such as hydrogen. As a result, the manufacturing cost is lowered than that of the second preferred embodiment.

As stated in the first preferred embodiment, even in the presence of the oxide layer 35, the metal layer 41 and the polysilicon layer 31 left therebelow cooperate in functioning as a gate electrode. Therefore, if an electrical contact with the source/drain region 82 is obtained, there is no need to remove the oxide layer 35, in order to expose the surface of the source/drain region 82.

It is desirable that the step of oxidizing the polysilicon layers 31 and 33 be performed after the step of forming the extension region 81, because the ion implantation is more facilitated than performing in the reverse order.

Fourth Preferred Embodiment

FIGS. 17 to 29 are cross sections illustrating a sequence of steps in a method of manufacturing a semiconductor device according to a fourth preferred embodiment. Firstly, the structure shown in FIG. 1 is prepared in the same manner as the first preferred embodiment. Using a silicon oxide film to be formed by thermal oxidation, alternatively, a nitride oxide film or nitride film, a gate insulating film 2 is formed in a thickness of about 1 to 4 nm, on a semiconductor substrate 1, and a polysilicon layer 31 is deposited thereon in a thickness of 5 to 100 nm. The polysilicon layer 31 has a conductivity. The thickness above described are just examples and not resticted to the values.

Unlike the first to third preferred embodiments, neither a silicide layer 4 nor metal layer 41 is provided, and a nitride film 5 that is the material of a dummy gate is stacked in a thickness of 20 to 300 nm, for example, on the polysilicon layer 31. An anti-reflection coating film 6 is formed on the nitride film 5. A resist 7 is formed on the anti-reflection coating film 6 and, by photolithography technology, it is then shaped as a mask pattern for obtaining a gate electrode. This results in the structure shown in FIG. 17. The gate width is set to, for example, 0.05 to 0.3 $\mu$m.

By using the resulting resist 7 as a mask, the nitride film 5 is etched to shape as a dummy gate. At this time, the anti-reflection coating film 6 is also etched in the same shape, resulting in the structure shown in FIG. 18. The anti-reflection coating film 6 and resist 7 are then removed.

Ions 83 are implanted from the polysilicon layer 31 side, by using the nitride film as a mask to form an extension region 81, resulting in the structure shown in FIG. 19. For transistors having different conductivity types, one type transistor is (or one type transistors are) masked with a patterned resist.

Like the first preferred embodiment, oxidation is performed so that the portion of the polysilicon layer 31 which is not covered with the nitride film 5 serving as a dummy gate, is oxidized to form an oxide layer 32, resulting in the structure shown in FIG. 20. As stated in the first preferred embodiment, the implantation of the ions 83 for forming the extension region 81 is preferably conducted before oxidizing the polysilicon layer 31.

Figure 21:
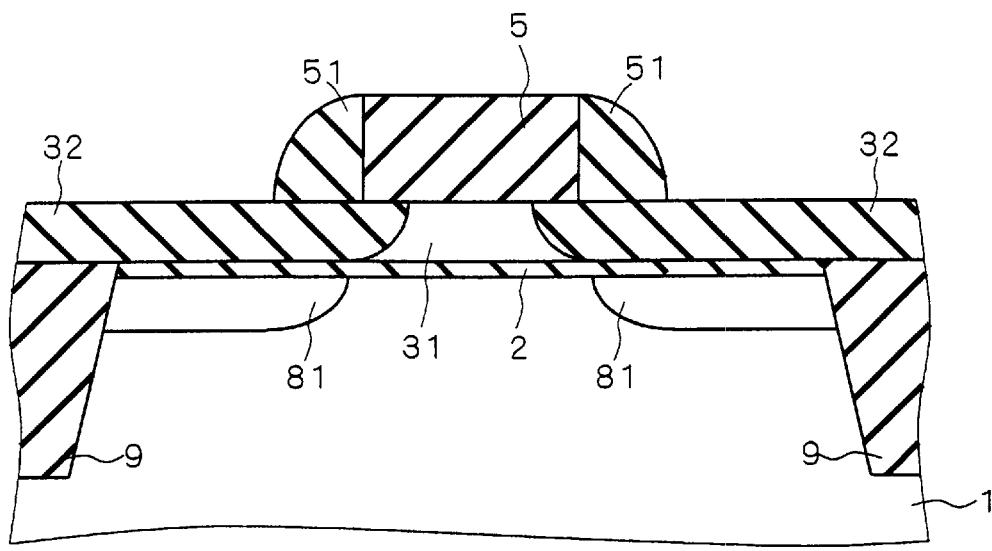
Figure 22:
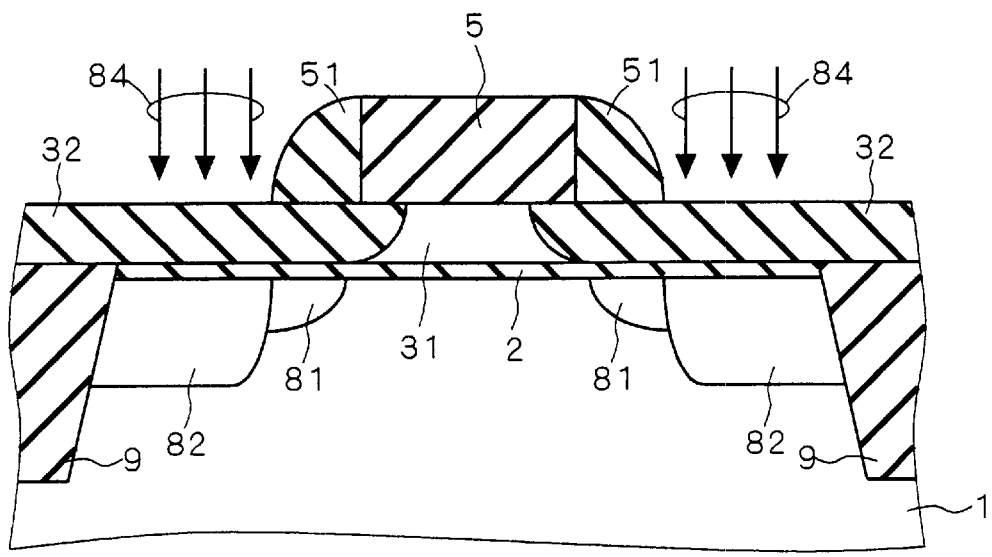

Like the first preferred embodiment, a sidewall 51 is formed with, for example, a nitride film, on the side of the nitride film 5 serving as a dummy gate, resulting in the structure shown in FIG. 21. By using the nitride film 5 and sidewall 51 as mask, ions 84 is implanted to the surface of the semiconductor substrate 1, to form a source/drain region 82, resulting in the structure shown in FIG. 22. The conditions of implanting the ions 83 and 84, and the conditions of activating the impurities can be set in the same manner as the first preferred embodiment.

Figure 23:
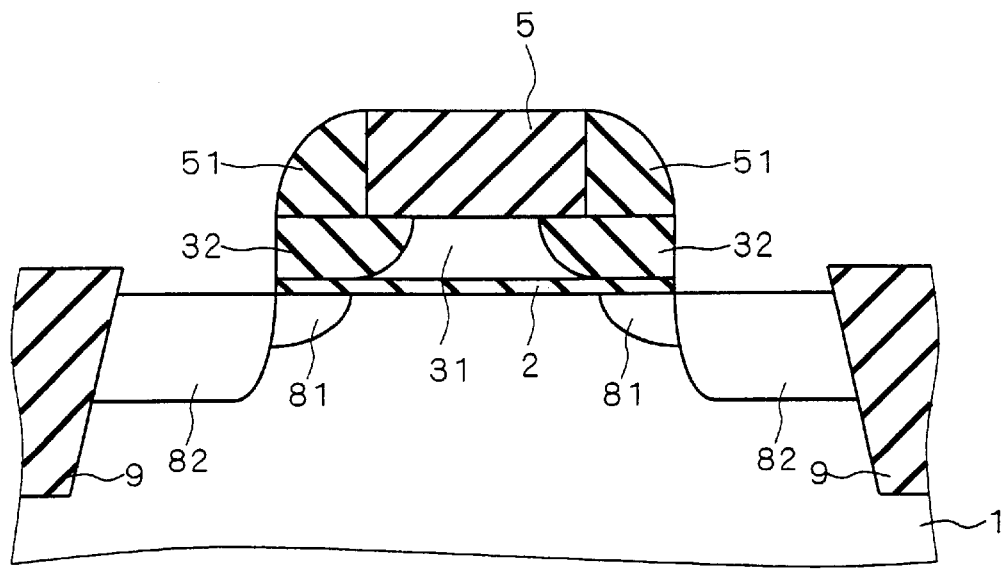

Thereafter, like the first preferred embodiment, the portion of the oxide layer 32 which is not covered with the nitride film 5 or sidewall 51, is removed to expose the surface of the semiconductor substrate 1, particularly, the source/drain region 82, thereby to obtain the structure shown in FIG. 23. A silicide layer 85 is formed on the surface of the source/drain region 82, resulting in the structure shown in FIG. 24.

Figure 24:
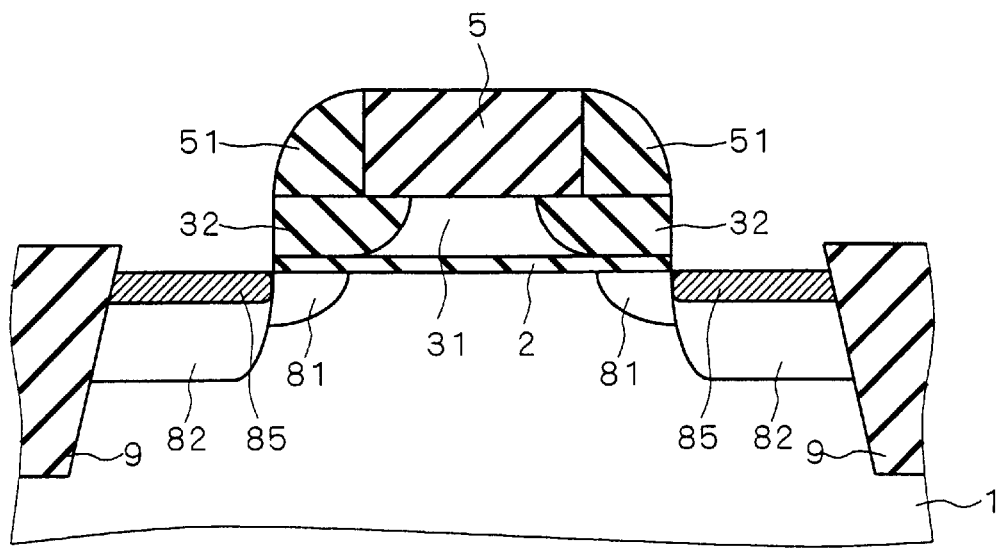

Subsequently, on the entire surface of the structure shown in FIG. 24, an oxide film 36 is formed by vapor deposition, resulting in the structure shown in FIG. 25. The thickness of the oxide film 36 is, for example, 30 to 500 nm, and it is at least larger than the thickness from the surface of the semiconductor substrate 1 to the top of the nitride film 5 or sidewall 51.

The top of the nitride film 5 is exposed by subjecting the structure shown in FIG. 25, to CMP (Chemical Mechanical Polish) from the oxide film 36 side. Thereby, the top of the nitride film 5 is approximately even with that of the oxide film 36, resulting in the structure shown in FIG. 26.

Subsequently, by using an etchant that has a high etching rate of a nitride film to an oxide film, the nitride film 5 is removed for forming a recess 50, the side of which is surrounded by the oxide film 36, and the bottom of which is surrounded by the polysilicon layer 31, and also by the oxide layer 32 sandwiching therebetween the polysilicon layer 31. This results in the structure shown in FIG. 27.

Figure 27:
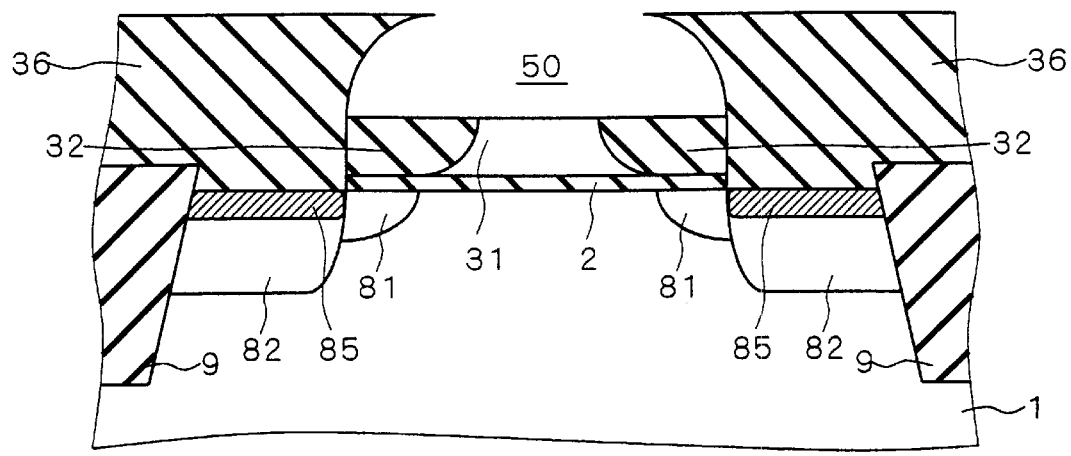
Figure 28:
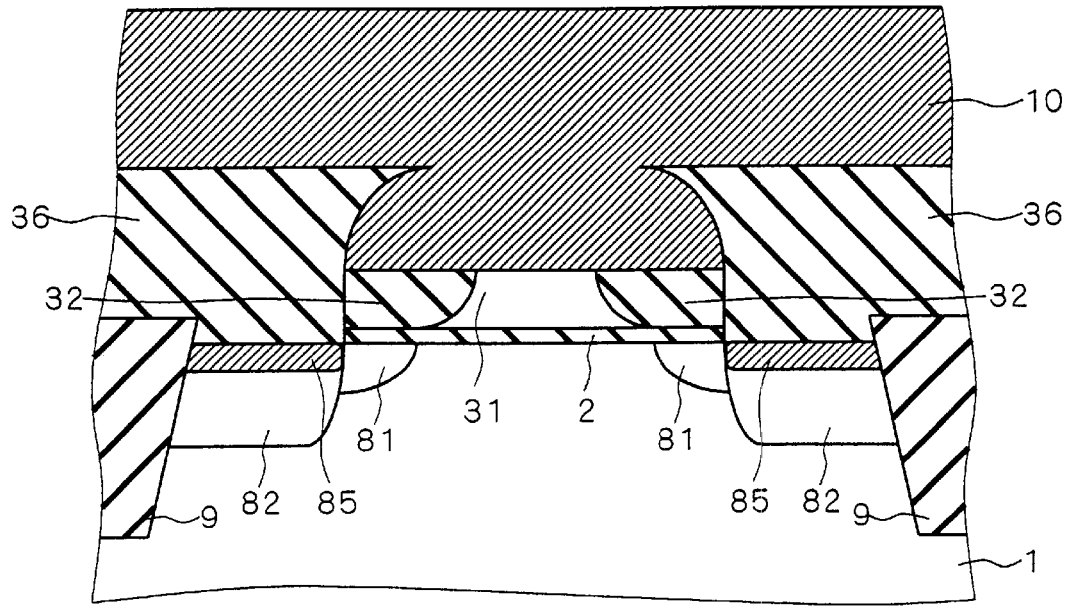

Then, on the structure shown in FIG. 27, metal 10, such as tungsten, is deposited from the oxide film 36 side, in such a thickness as to fill the recess 50, thereby obtaining the structure shown in FIG. 28. Here at, the metal 10 is in contact with the polysilicon 31. The top of the oxide film 36 is exposed by performing CMP from the metal 10 side. Thereby, the top of the metal 10 is approximately even with that of the oxide film 36, resulting in the structure shown in FIG. 29.

In the fourth preferred embodiment, the polysilicon layer 31 is not etched but is left only below the nitride film 5, by oxidizing it in a self-aligned manner by using, as a mask, the nitride film 5 serving as a dummy gate. The metal 10 is provided in the position at which the nitride film 5 has been present, and also the position at which the sidewall 51 has been present, and therefore, the metal 10 and the underlying polysilicon layer 31 cooperate in functioning as a gate electrode. Thus, even when using, as a gate insulating film 2, a material with which it is unable to have a high etching selective ratio to the polysilicon layer 31, the gate electrode can be formed reliably. In addition, the feature that the metal 10 is used for the gate electrode, and that the oxide layer 32 is formed before forming the metal 10, enable to provide not only the effect resulting from the second preferred embodiment, but also the effect resulting from the third preferred embodiment.

Furthermore, since the heat treatment of the source/drain region 82, and the formation of the silicide layer 85 are both conducted before forming the metal 10, it is able to avoid such problems that can occur due to the rise in temperature accompanied by these steps, for example, the silicidation between the metal 10 and the polysilicon layer 31 underlying the metal 10, and impurity diffusion.

Also, the metal 10 can be provided in not only the area where the nitride film 5 has been present, but also the area where the sidewall 51 has been present. Accordingly, the area of the metal 10 can be increased than the case with the conventional gate replace method, thus permitting a reduction in the gate electrode resistance. This enables to notably enjoy the effect of the second preferred embodiment.

Figure 30:
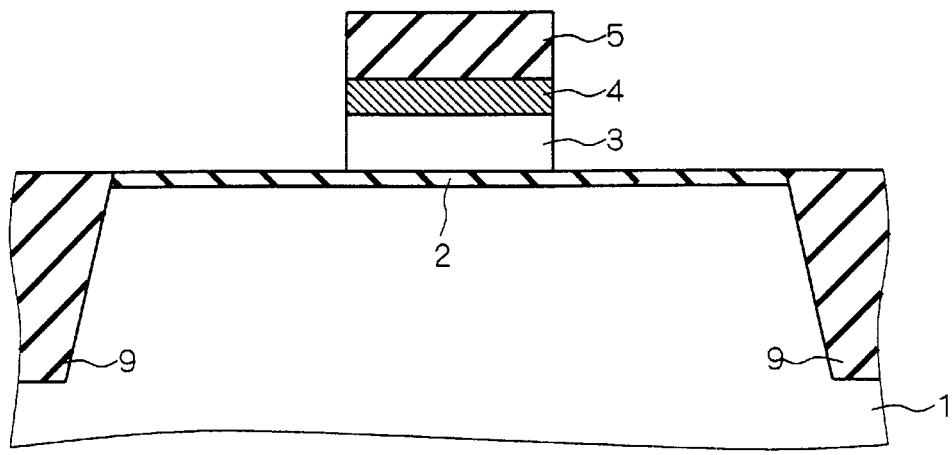
FIG. 30 is a cross section illustrating a conventional technique.
Figure 33:
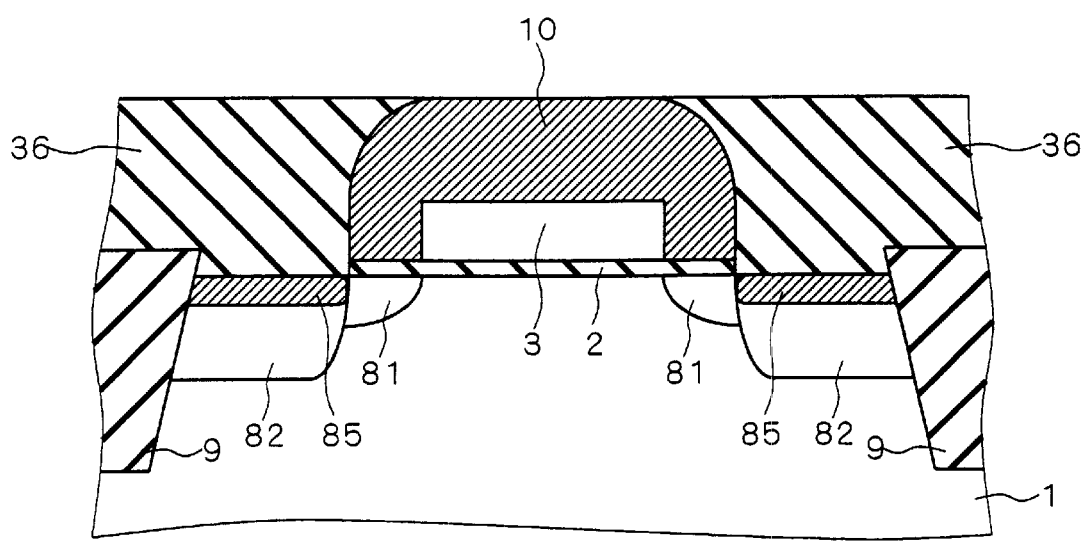

FIG. 33 shows the structure obtained by the following steps. That is, on the structure shown in FIG. 30, an extension region 81, sidewall 51, source/drain region 82, silicide layer 85, oxide film 36 are formed in the order named; a nitride film 5 is exposed by performing CMP; the nitride film 5 is then removed to form a recess surrounded by an insulating layer 2 and oxide film 36; and the recess is then filled with metal 10. The metal 10 surrounds the polysilicon layer 31 because no selective oxidation of the polysilicon layer 31 is performed. As a result, the insulation between the metal 10 serving as a gate electrode, and the source/drain region 82 including the silicide layer 85, is carried out by the gate insulating film 2 having such damage as described with reference to FIGS. 31 and 32, and a thin portion of the oxide film 36 which is present between the metal 10 and the silicide layer 85.

Figure 29:
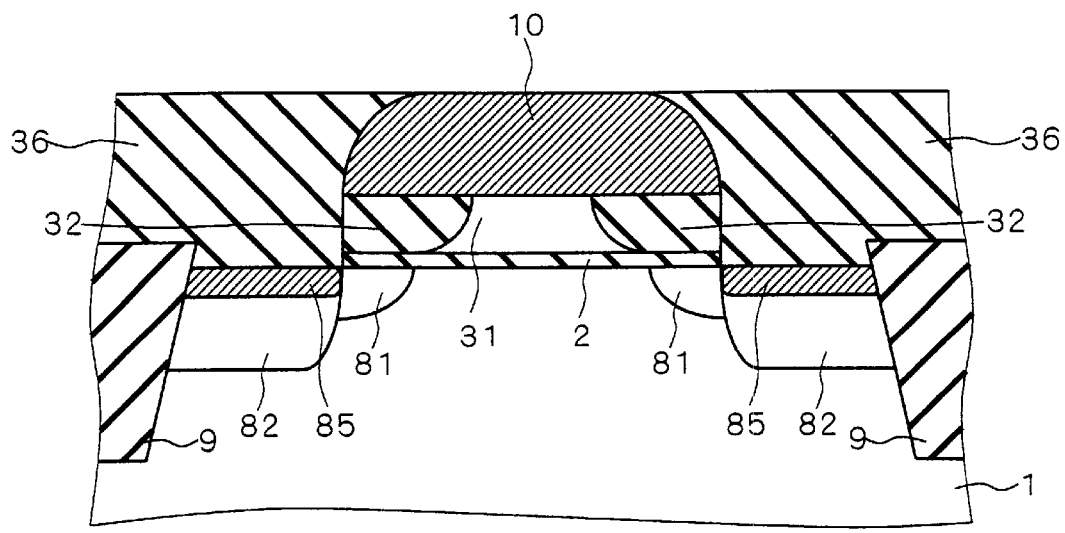

When compared to the structure shown in FIG. 33, the structure shown in FIG. 29 can provide superior insulation between the gate electrode formed by the metal 10 and polysilicon layer 31, and the source/drain region 82, because the oxide layer 32 underlies the end of the metal 10. This effect is also obtainable in the structure shown in FIG. 9 of the first preferred embodiment, or the structure shown in FIG. 16 of the third preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:
   (a) forming a gate insulating film on a surface of a semiconductor substrate of a first conductivity type;
   (b) forming a first conductive layer on said gate insulating film;
   (c) selectively forming a second conductive layer on said first conductive layer;

(d) selectively imparting an insulating property to said first conductive layer by using said second conductive layer as a mask, to obtain an insulating layer; and (e) forming a pair of source/drain regions of a second conductivity type opposite to the first conductivity type, so as to sandwich therebetween said surface of said semiconductor substrate underlying said first conductive layer left in said step (d).

2. The method according to claim 1, wherein said first conductive layer comprises a doped semiconductor, and said doped semiconductor is selectively oxidized in said step (d), said method further comprising the step, after said step (e), of:

(f) performing an etching of said insulating layer and said gate insulating film so that the insulating layer and the gate insulating film are selectively removed to expose said source/drain regions.

3. The method according to claim 2, further comprising the step of:

(g) performing a silicidation of said source/drain regions exposed in said step (f).

4. The method according to claim 2, further comprising the step, after said step (c) and before said step (d), of:

(g) implanting impurities to said surface of said semiconductor substrate by using said second conductive layer as a mask, so as to form a pair of extension regions of the second conductivity type in said surface of said semiconductor substrate.

5. The method according to claim 2, wherein said second conductive layer comprises a metal, and, in said step (d) an oxidation is conducted in an oxidizing atmosphere having a reducing component.

6. The method according to claim 5, wherein said reducing component includes hydrogen.

7. The method, according to claim 1, further comprising the step, after said step (c) and before said step (d), of:

(f) forming a coating layer covering said second conductive layer and said first conductive layer, and wherein, in said step (d), the insulating property is imparted to said coating layer and said coating layer becomes a part of said insulating layer.

8. The method according to claim 7, wherein said first conductive layer comprises a doped first semiconductor, said coating layer comprises a material that is an oxidizable material, and said first semiconductor and said material are oxidized in said step (d), said method further comprising the step, after said step (e), of:

(g) selectively removing said insulating layer and said gate insulating film to expose said source/drain regions.

9. The method according to claim 8, further comprising the step, after said step (d) and before said step (f), of:

(h) implanting impurities to said surface of said semiconductor substrate by using, as a mask, said second conductive layer and said coating layer present on the side of the second conductive layer, thereby to form a pair of extension regions of the second conductivity type in said surface of said semiconductor substrate.

10. The method according to claim 8, wherein said second conductive layer comprises a metal, and said coating layer comprises a second semiconductor, said method further comprising the step, after said step (d) and before said step (f), of:

(h) performing a heat treatment for forming a silicide layer at the interface between said second conductive layer and said coating layer.

* * * * *